United States Patent
Petropoulos

Patent Number: 5,977,771
Date of Patent: Nov. 2, 1999

[54] SINGLE GRADIENT COIL CONFIGURATION FOR MRI SYSTEMS WITH ORTHOGONAL DIRECTED MAGNETIC FIELDS

[75] Inventor: Labros S. Petropoulos, Solon, Ohio

[73] Assignee: Picker International, Inc., Highland Hts, Ohio

[21] Appl. No.: 08/963,660

[22] Filed: Nov. 3, 1997

[51] Int. Cl.$^6$ ................................................. G01V 3/00
[52] U.S. Cl. ........................................... 324/318; 324/322
[58] Field of Search ................................... 324/318, 319, 324/320, 322, 300, 307, 309

[56] References Cited

U.S. PATENT DOCUMENTS

| | | | |
|---|---|---|---|
| 4,926,125 | 5/1990 | Roemer | 324/318 |
| 5,036,282 | 7/1991 | Morich et al. | 324/318 |
| 5,402,094 | 3/1995 | Enge | 324/319 |
| 5,555,251 | 9/1996 | Kinanen | 324/318 |

OTHER PUBLICATIONS

Actively Shielded Biplanar Gradient Set of Open Magnet Geometries With Vertically Directed Fields by L.S. Petropoulos.
Actively Shield Gradient Coils for Wrist Imaging by L.S. Petropoulos.
Planar Surface Gradient Coil by Z.H. Cho.

*Primary Examiner*—Louis Arana
*Attorney, Agent, or Firm*—Fay, Sharpe, Fagan, Minnich & McKee, LLP

[57] ABSTRACT

A magnetic resonance imaging apparatus (10) has a main magnet having a pair of pole faces (16,18) defining an examination region (14). The main magnet generates a main magnetic field (12). A couch (30) suspends a subject within the examination region (14). A uniplanar gradient coil assembly (40) is positioned to one side of the subject. The uniplanar gradient coil assembly (40) generates magnetic field gradients across the examination region (14). The uniplanar gradient coil assembly (40) includes coil loop arrays each residing in a plane which is transverse to the main magnetic field (12). A current supply (42) supplies a electrical current pulses to the coil loop arrays. A radio frequency pulse generator (50) is employed for selectively exciting magnetic resonance of dipoles within the examination region (14). A receiver (54) receives magnetic resonance signals from the resonating dipoles and a reconstruction processor (62) forms an image representation from the magnetic resonance signals received. In one embodiment, the uniplanar gradient coil assembly (40) is housed within an interior of the couch (30) and a mechanical adjustment mechanism (70) adjusts the height of the uniplanar gradient coil assembly (40) to align the magnetic gradient region having optimum linearity with an area of interest of the subject.

12 Claims, 6 Drawing Sheets

SINGLE GRADIENT COIL CONFIGURATION FOR MRI SYSTEMS WITH ORTHOGONAL DIRECTED MAGNETIC FIELDS

BACKGROUND OF THE INVENTION

The present invention relates to the art of magnetic field gradient generation. It finds particular application in conjunction with establishing gradient magnetic fields in magnetic resonance imaging techniques and will be described with particular reference thereto. It is to be appreciated, however, that the invention will also find application in spectroscopy and other processes and apparatus in which accurately predictable magnetic field gradients are established or maintained.

In magnetic resonance imaging, a uniform magnetic field is created through an examination region in which a subject to be examined is disposed. A series of radio frequency pulses and magnetic field gradients are applied to the examination region to excite and manipulate magnetic resonances. Gradient fields are conventionally applied as a series of gradient pulses with preselected profiles.

The gradient magnetic pulses are applied to select and encode the magnetic resonance signals. In some cases, the magnetic field gradients are applied to select one or more planes or slices to be imaged. Gradient field pulses are also applied for selectively modifying the uniform magnetic field to encode frequency and phase into the magnetization, hence the resonance signals in order to identify a spatial location.

The magnetic resonance signals are then processed to generate two or three dimensional image representations of a portion of the subject in the examination region. The accuracy of the resultant image representation, among other factors, is dependent upon the accuracy with which the actually applied magnetic field gradient pulses conform to selected gradient pulse profiles.

Conventionally, the uniform main magnetic field is generated in one of two ways. The first method employs a cylindrically shaped solenoidal main magnet. The central bore of the main magnet defines the examination region in which a horizontally directed main magnetic field is generated. The second method, employs a main magnet having opposing poles arranged facing one another to define the examination region therebetween. The poles are typically connected by a C-shaped or a four post ferrous flux return path. This configuration generates a vertically directed main magnetic field within the examination region. The C-shaped main magnet, often referred to as having open magnet geometry, has been able to resolve important MRI issues such as, increasing the patient aperture, avoiding the patient claustrophobia, and improving access for interventional MRI applications. However, the design of gradient coils for generating linear magnetic field gradients differs from that for the cylindrical type horizontal field system due to the direction of the main magnetic field.

In the solenoidal coil type systems, conventional gradient coils included coils wound in a bunched or distributed fashion on a large diameter hollow right cylinder tube. Conventional bunch geometries include Maxwell or modified Maxwell pair for Z gradient production and single or multi-arch golay saddle coils for X and Y gradient production. The coils are normally wound in a series arrangement in a position to give a magnetic field profile with the desired linearity over a predefined volume. However, the large inductances which are typical in wound cylindrical gradient coils, limit the switching speed of the gradient magnetic field.

Planar gradient magnetic field assemblies have been developed for the cylindrical main magnets with horizontally directed fields. The assembly includes a pair of planar Y-gradient coils, a pair of planar X-gradient coils, and a pair of Z-gradient coils. However, this type of planar gradient magnetic field assembly would not be directly compatible with main magnets having vertically directed fields. That is to say, that in main magnets with horizontally directed fields the direction of the main magnetic field is parallel to the planar surface of the gradient coil while in main magnets with vertically directed fields the direction of the main field is orthogonal or transverse to the planar surface of the gradient coil.

In open magnet systems with vertically directed fields, it has been known to use a bi-planar gradient coil system for generation of the magnetic field gradients. However, the use of this type of bi-planar gradient coil system somewhat detracts from the purpose of using an open magnet geometry in that it reduces the patient aperture and diminishes access for interventional MRI applications by employing two planar gradient coils one on either side of the subject being examined. As well, the performance of the bi-planar configuration can suffer in terms of its strength and slew rate.

The present invention contemplates a new and improved gradient coil configuration is provided which overcomes the above-referenced problems and others.

SUMMARY OF THE INVENTION

In accordance with one aspect of the present invention, a magnetic resonance imaging apparatus is provided. The magnetic resonance imaging apparatus includes a main magnet having a pair of pole faces which defines and examination region therebetween. The main magnet generates a main magnetic field. Also included, is a couch for suspending a subject within the examination region. A uniplanar gradient coil is provided on one side of the subject for generating magnetic field gradients across the examination region. The uniplanar gradient coil includes coil loop arrays each residing in a plane which is transverse to the main magnetic field. A current supply supplies an electrical current pulses to the coil loop arrays. A radio frequency pulse generator selectively excites magnetic resonance of dipoles within the examination region and a receiver picks up signals from the resonating dipoles. A reconstruction processor is used to reconstruct an image representation from the magnetic resonance signals.

In accordance with a more limited aspect of the present invention, the main magnet includes a ferrous flux return path between the pole faces.

In accordance with a more limited aspect of the present invention, an electromagnetic shield is positioned between the uniplanar gradient coil assembly and the pole face that is on a common side of the subject as the uniplanar gradient coil assembly.

In accordance with a more limited aspect of the present invention, the uniplanar gradient coil is housed within an interior of the couch.

In accordance with a more limited aspect of the present invention, the ends of the uniplanar gradient coil assembly are flared.

In accordance with a more limited aspect of the present invention, the uniplanar gradient coil assembly has three coil loop arrays one each for generating X, Y, and Z gradients.

In accordance with a more limited aspect of the present invention, the magnetic resonance imaging apparatus further includes an adjusting mechanism for mechanically moving the uniplanar gradient coil for imaging different areas of the subject being examined.

In accordance with a more limited aspect of the present invention, the magnetic resonance imaging apparatus has no gradient coils on a side of the subject opposite the side on which the uniplanar gradient coil is located.

In accordance with another aspect of the present invention, a method of magnetic resonance imaging is provided. The method includes generating a vertical main magnetic field in an examination region. A subject to be examined is supported within the examination region and coil array are positioned to only one side of the subject. Electrical current pulses are applied to the coil arrays to produce magnetic field gradients in the vertical main magnetic field. Magnetic resonance is selectively excited in dipoles within the examination region and the magnetic resonance signals from the dipoles are received. From the magnetic resonance signals, an image representation is reconstructed.

In accordance with a more limited aspect of the present invention, further including the step of mechanically moving the coil loop arrays for imaging a different area of the subject.

In accordance with a more limited aspect of the present invention, further including the step of shielding the coil loop arrays.

In accordance with another aspect of the present invention, a gradient magnetic field generating coil assembly is included in a magnetic resonance imaging apparatus having a main magnet including at least one pole which defines an examination region thereabove which main magnet generates a vertical main magnetic field in the examination region, a couch which supports a subject to be examined within the examination region, a radio frequency transmitter for selectively exciting dipoles within the examination region, a receiver which receives magnetic resonance signals from dipoles resonating within the examination region, and an image processor which reconstructs an image representation from the magnetic resonance signals for display on a human viewable display. The gradient coil assembly has a uniplanar gradient coil positioned in the interior cavity of the couch on only one side of the subject to be examined having an array of coil loops which reside in a plane transverse to the main magnetic field. The gradient coil assembly also includes current supply which supplies an electrical current to the array of coil loops such that as the electrical current flows through the array of coil loops a substantially linear magnetic gradient is set up in the main magnetic field.

In accordance with a more limited aspect of the present invention, the gradient coil assembly includes a mechanical adjusting mechanism which moves the uniplanar gradient coil for aligning a depth of optimal uniplanar gradient coil linearity with a depth of a region of the subject to be examined.

In accordance with a more limited aspect of the present invention, the gradient coil assembly includes an electromagnetic shield coil assembly positioned between the uniplanar gradient coil and the pole of the main magnet.

In accordance with a more limited aspect of the present invention, no gradient coils are positioned above the subject.

One advantage of the present invention is that it provides faster slew rates. Specifically for comparable gradient strengths, the slew rate of a uniplanar coil is substantially twice the slew rate of a corresponding bi-planar coil.

Another advantage of the present invention is the reduction of stored magnetic energy resulting in the improvement of the gradient strength and rise time.

Yet another advantage is increased patient aperture and improved accessibility for interventional MRI applications.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purpose of illustrating a preferred embodiment and are not to be construed as limiting the invention.

DETAILED DESCRIPTION OF THE PREFERRED EMBODIMENT

Figure 1:
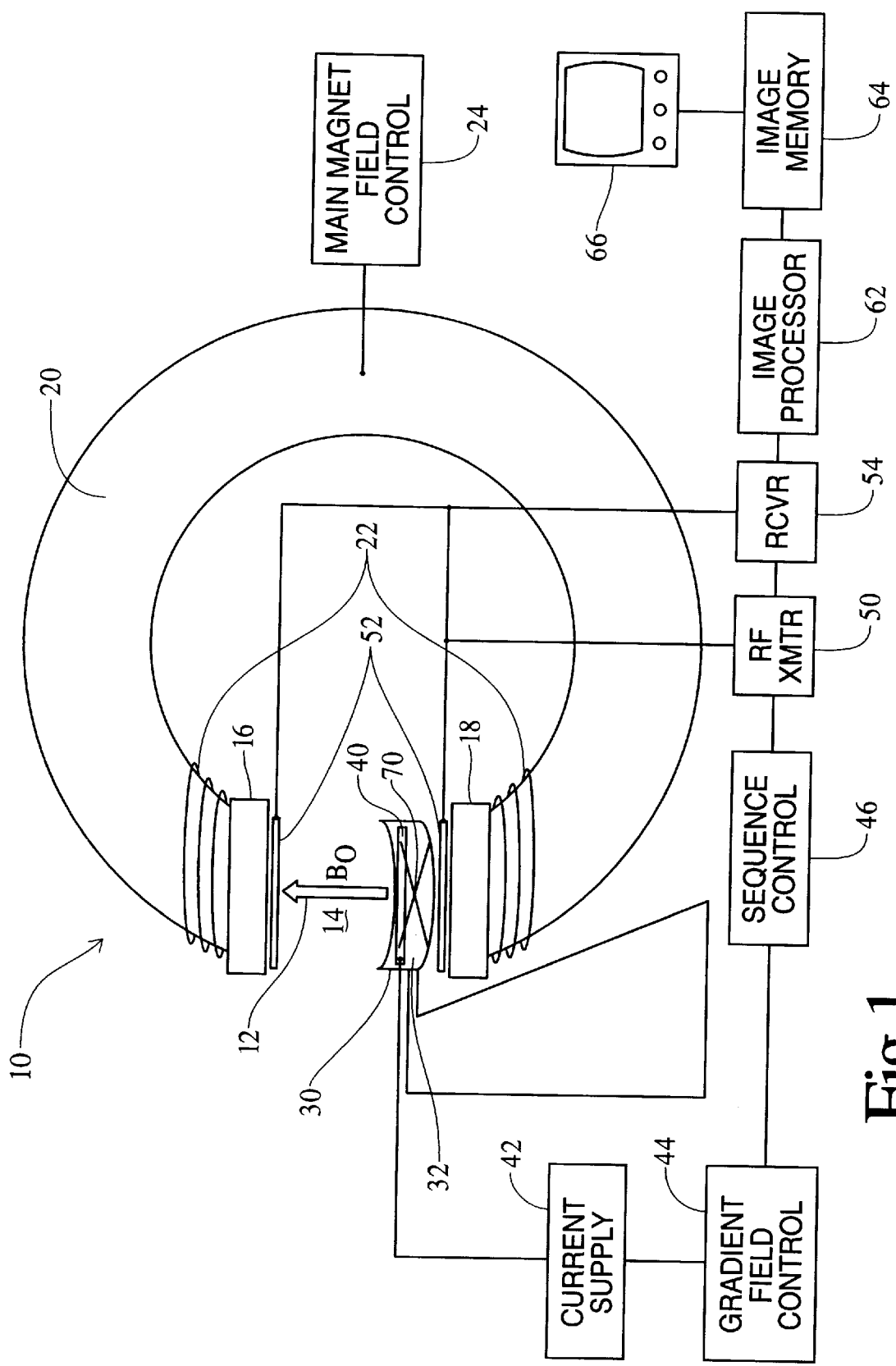
FIG. 1 is a diagrammatic illustration of a magnetic resonance imaging apparatus with a uniplanar gradient coil in accordance with the present invention.

With reference to FIG. 1, a magnetic resonance imaging apparatus 10 generates a substantially uniform vertical magnetic field 12 through an examination region 14 defined by opposing magnetic pole pieces 16, 18. Preferably, the main magnetic field 12 is a strong substantially uniform field that is aligned with a z or vertical axis. In the illustrated embodiment, the opposing magnetic pole pieces 16, 18 are connected by a ferrous flux return path 20. Electrical main field coils 22 are operated under control of a main magnetic field control circuit 24. Preferably, the main field coils 22 include coil segments disposed adjacent to or in conjunction with each of the opposing magnetic pole pieces 16, 18. However, the main field coils 22 can be disposed anywhere along the ferrous flux return path 20.

A couch 30 suspends a subject within the examination region 14. Preferably the couch 30 is movable so as to be selectively inserted and retracted from the examination region 14. An interior cavity 32 of the couch 30 houses a uniplanar gradient coil assembly 40.

Figure 2:
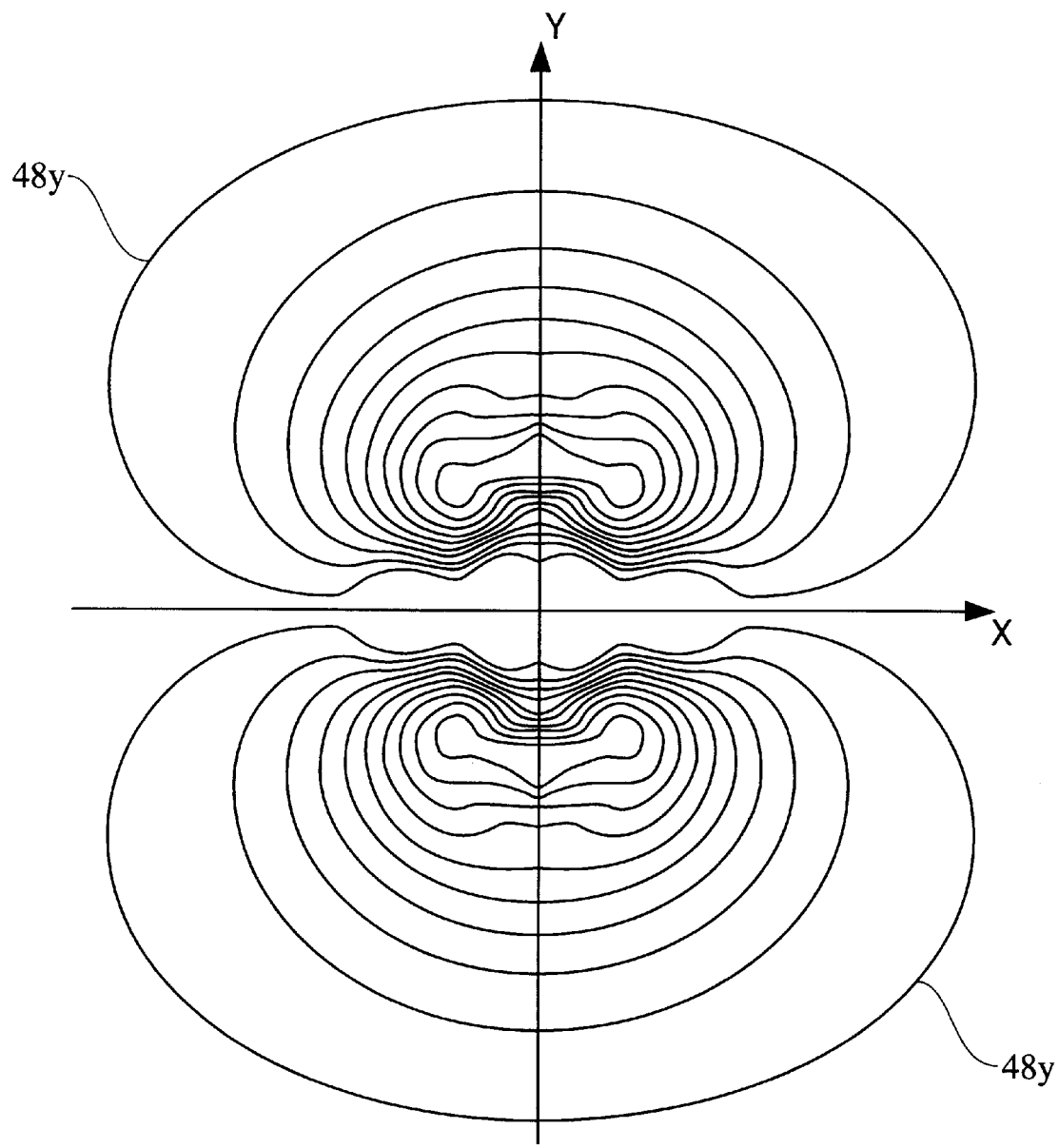
FIG. 2 illustrates a coil loop array for the Y-uniplanar gradient coil which is symmetrical about the x axis.
Figure 3:
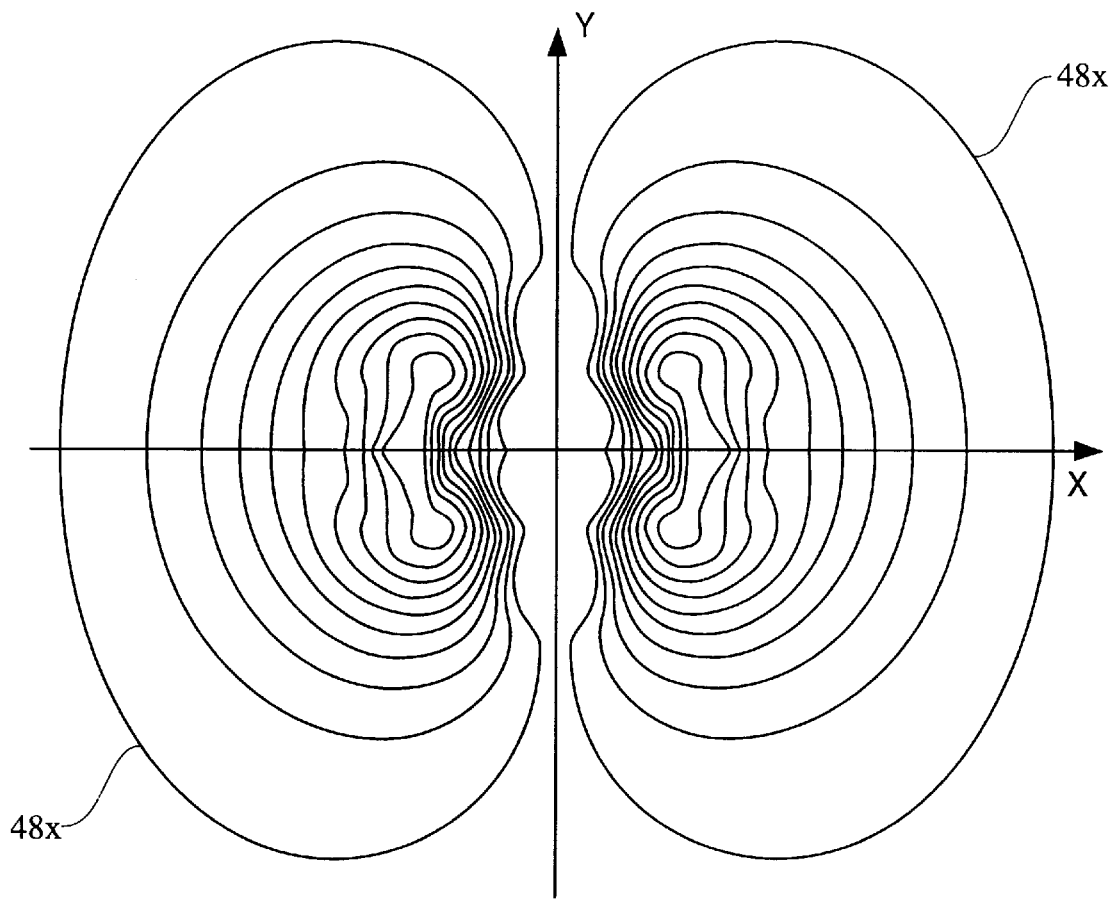
FIG. 3 illustrates a coil loop array for the X-uniplanar gradient coil which is symmetrical about the y axis.
Figure 4:
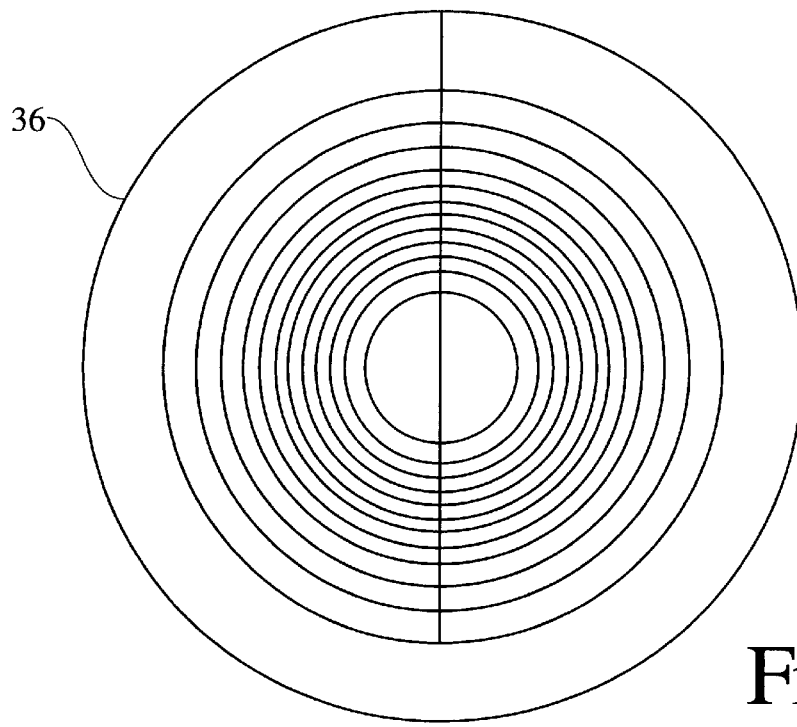
FIG. 4 illustrates a coil loop array for the Z-uniplanar gradient coil.

The uniplanar gradient coil assembly 40 selectively creates gradient magnetic fields across the examination region 14. The uniplanar gradient coil assembly 40 includes a Y-gradient coil loop array (illustrated in FIG. 2) which applies gradients along a y axis, preferably a horizontal axis transverse to the z axis. Analogously, an X-gradient coil loop array (illustrated in FIG. 3) selectively applies gradients in the x direction, preferably a horizontal direction transverse to the z axis and orthogonal to the y axis. A Z-gradient coil loop array (illustrated in FIG. 4) generates a magnetic field gradient in the vertical z direction parallel to the main magnetic field 12. More specifically to the preferred embodiment, each of the X, Y, and Z gradient coil loop arrays include a plurality of symmetrically arranged windings or coil loops as shown in FIGS. 2–4. Each of the coil loop arrays are disposed on an individual planar surface which is transverse to the main magnetic field 12.

A current supply 42 selectively supplies electrical current pulses to the coil loop arrays of the uniplanar gradient coil assembly 40. A gradient field control means 44 is controlled by a sequence control processor 46 to control the current supply to cause it to apply appropriate current pulses to the windings of the coil loop arrays to cause selected gradient pulses.

The sequence control processor 46 controls a radio frequency transmitter 50 for generating radio frequency pulses of the appropriate frequency spectrum for inducing resonance in selected dipoles disposed in the examination region 14. The radio frequency 50 transmitter is connected to a radio frequency antennae 52 disposed adjacent the examination region for transmitting radio frequency pulses into a region of interest of the patient or other subject in the examination region 14. The radio frequency antennae may be disposed adjacent a surface of the magnetic poles pieces 16, 18, in the interior cavity 32 of the couch 30, or on the subject to be examined. For example, a surface coil may be positioned contiguous to an examined patient or subject for controllably inducing magnetic resonance in a selected contiguous region of the patient.

A magnetic resonance receiver 54 receives signals from resonating dipoles within the examination region 14. The signals are received via the same antennae that transmits the radio frequency pulses. Alternately, separate receiver coils may be used. For example, receive only surface coils may be disposed contiguous to a selected region of the patient to receive resonance induced therein by a radio frequency transmitting coil surrounding the examination region 14. Ultimately, the radio frequency signals received are demodulated and reconstructed into an image representation by a reconstruction processor 62. The image may represent a planar slice through the patient, an array of parallel planar slices, a three dimensional volume, or the like. The image is then stored in an image memory 64 where it may be accessed by a display, such as a video monitor 66 which provides a man readable display of the resultant image.

Each of the x, y, and z coil loop arrays include a single surface that is transverse to the main magnetic field. Each surface includes a sheet of non-magnetic and non-conducting material on which the distributed conductive coil array is mounted. The distributed coil patterns represent a discrete approximation of an optimal, continuous current distribution. The optimal current is computed to yield minimum stored energy for the desired magnetic field pattern. For the preferred imaging embodiment, the magnetic field pattern is a linear gradient.

Since the current density lies in the xy plane, the expression of the current distribution $J(x,y)$ is:

$$J(x,y)=[J_x(x,y)\hat{x}+J_y(x,y)\hat{y}]. \quad (1)$$

Therefore, the expressions of the two components of the magnetic vector potential $A(x,y)$ are:

$$A_y = \frac{\mu_0}{8\pi^2} \int\int_{-\infty}^{+\infty} \frac{d\alpha d\beta}{\sqrt{\alpha^2+\beta^2}} e^{i\alpha x+i\beta y}\left[J_y(\alpha,\beta)e^{-\sqrt{\alpha^2+\beta^2}\,z}\right] \quad (2)$$

$$A_y = \frac{\mu_0}{8\pi^2} \int\int_{-\infty}^{+\infty} \frac{d\alpha d\beta}{\sqrt{\alpha^2+\beta^2}} e^{i\alpha x+i\beta y}\left[J_y(\alpha,\beta)e^{-\sqrt{\alpha^2+\beta^2}\,z}\right], \quad (3)$$

where $J_{x,y}(\alpha,\beta)$ represent the double Fourier transform of the $J_{x,y}(x,y)$ components of the current density, respectively. Where the current continuity equation is $\vec{\nabla}\cdot\vec{J}=0$, the relationship for these two components of the current density in the Fourier domain is:

$$J_y(\alpha,\beta) = -\frac{\alpha}{\beta}J_x(\alpha,\beta). \quad (4)$$

Therefore, the stored magnetic energy of the coil is:

$$W_m = \frac{1}{2}\int_V d^3 \times \vec{A}\cdot\vec{J} = \frac{\mu_0}{16\pi^2}\int\int_{-\infty}^{+\infty}\frac{d\alpha d\beta}{\beta^2}\sqrt{\alpha^2+\beta^2}\,|J_x|^2; \quad (5)$$

while the expression for the magnetic field component along the main field direction z is:

$$B_z = -\frac{i\mu_0}{8\pi^2}\int\int_{-\infty}^{+\infty}\frac{d\alpha d\beta}{\beta}\sqrt{\alpha^2+\beta^2}\,e^{i\alpha x+i\beta y}J_x(\alpha,\beta)e^{-\sqrt{\alpha^2+\beta^2}\,z}. \quad (6)$$

For the Y-gradient coil, the magnetic field component along the z direction must be antisymmetric along the y axis and symmetric along the x direction, so that equation (6) becomes:

$$B_z = \quad (7)$$

$$\frac{\mu_0}{2\pi^2}\int\int_0^{+\infty}\frac{d\alpha d\beta}{\beta}\sqrt{\alpha^2+\beta^2}\,\cos(\alpha x)\sin(\beta y)J_x(\alpha,\beta)e^{-\sqrt{\alpha^2+\beta^2}\,z}.$$

Examination of the expression of the magnetic field reveals that the Fourier component of $J_x$ is symmetric in both $\alpha$ and $\beta$, i.e.

$$J_x(\alpha,\beta) = 4\int\int_0^{+\infty} dx dz \cos(\alpha x)\cos(\beta y)J_x(x,y). \quad (8)$$

Based on the energy minimization mechanism, the functional $\epsilon$ in terms of the magnetic field and the stored magnetic energy is:

$$\mathcal{E}(J_x) = W_m - \sum_{j=1}^{N}\lambda_j(B_z(\vec{r}_j) - B_{zSC}(\vec{r}_j)), \quad (9)$$

where $W_m$ is the stored energy, $\lambda_j$ are the Lagrange multipliers, $B_z(\vec{r}_j)$ is the calculated value of the magnetic field at constraint points $\vec{r}_j$ and $B_{zsc}(\vec{r}_j)$ are constraint values of the magnetic field at the constraint points.

Minimizing $\epsilon$ with respect to the current density $J_x$, the matrix equation for $J_x$ is:

$$J_x = \beta \sum_{j=1}^{N} \lambda_j \cos(\alpha x_j)\sin(\beta y_j) e^{-\sqrt{\alpha^2+\beta^2}\, z_j}. \quad (10)$$

Lagrange multipliers $\lambda_j$ are determined using the constraint equation for the magnetic field, and the continuous current density distribution for the $J_x$ and $J_y$ components of the current density are obtained. Applying the stream function technique to the continuous current density, discrete current patterns for the current density are generated which are adequate for the creation of a high quality gradient field along the y direction. Then, the magnetic field is re-evaluated inside and outside the imaging volume by applying the Biot-Savart formula to the discrete current distribution.

While the plane is mathematically assumed to be infinite, practically, a current apodization scheme is performed in order to contain the current within acceptable bounds along the x and y directions.

TABLE 1

Constraint set used for the design of Y-gradient coil, values for x, y, and z are in m, values for $B_{zSC}$ are in T.

| n | $x_i$ | $y_i$ | $z_i$ | $B_{zSC}$ (2n) |
|---|---|---|---|---|
| 1 | 0.0000 | 0.001 | 0.100 | 0.00002000 |
| 2 | 0.0000 | 0.060 | 0.100 | 0.00120000 |
| 3 | 0.0000 | 0.200 | 0.100 | 0.00364000 |
| 4 | 0.1800 | 0.001 | 0.100 | 0.00001800 |
| 5 | 0.0000 | 0.001 | 0.150 | 0.00002050 |
| 6 | 0.0000 | 0.001 | 0.200 | 0.00001750 |

Figure 5:
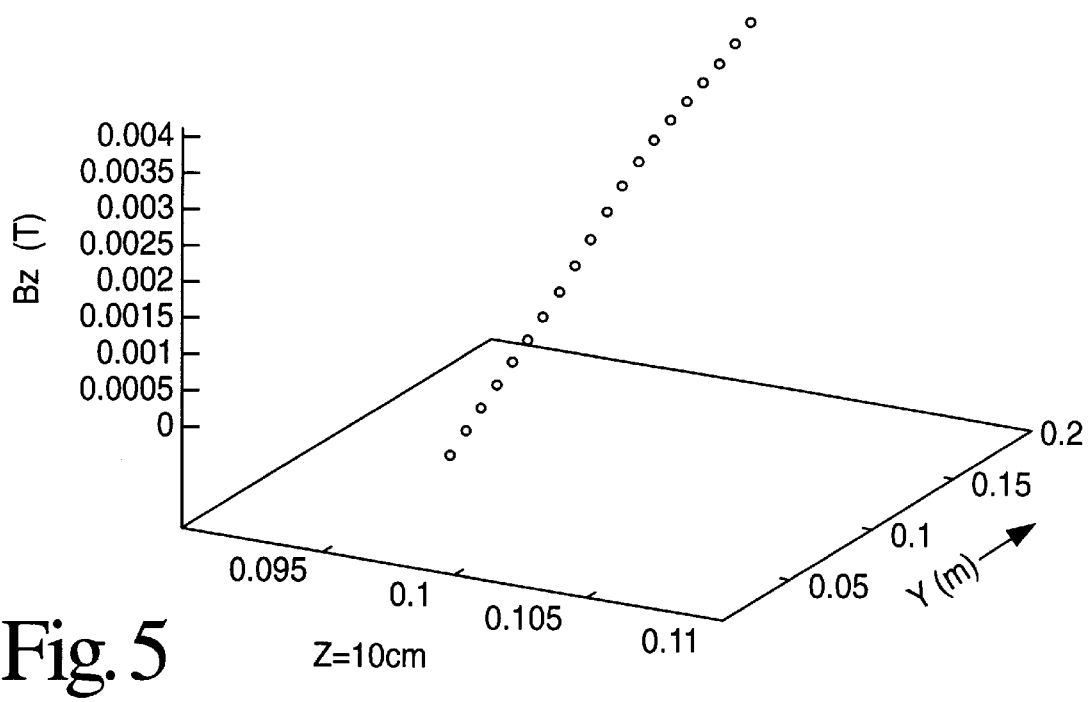
FIG. 5 is a one-half plot of the $B_z$ component of the magnetic field along the y gradient direction.
Figure 6:
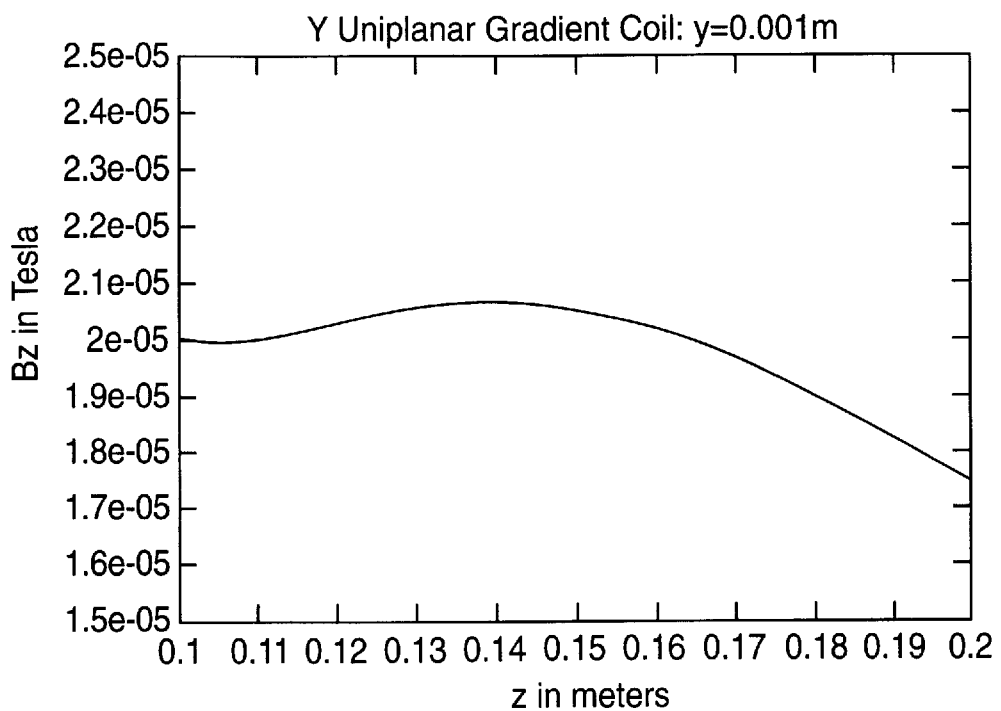
FIG. 6 is a one-half plot of the $B_z$ component of the magnetic field along the z direction for the Y-gradient coil.

In a preferred embodiment, six constraint points define the characteristics of the field inside an imaging volume (see Table 1). The imaging volume extends ±20 cm along the x, y axes in the z=+10 cm plane, and along the positive z axis +10 cm starting from the z=+10 cm location. The first three constraint points define a gradient strength of 20 mT/m inside the imaging volume with a 15% on-axis linearity. Three constraint points along the gradient coil axis are used to contain the on-axis non-linearity of the gradient coil to acceptable levels. The uniformity of the gradient field inside this imaging volume is restricted to less than 20% variation from its actual value. By applying the constraints continuous current distributions are obtained. The discrete current pattern of 10 positive loops (as seen in FIG. 2) is obtained by employing the stream function technique. Using the Biot-Savart law, the z component of the magnetic field is evaluated along the gradient axis y (as seen in FIG. 5) and along the z direction (as seen in FIG. 6).

For the same gradient strength and comparable gradient field characteristics, the slew rate of the uniplanar gradient coil is more than twice the slew rate of a corresponding bi-planar gradient coil.

The X-gradient coil is treated in a similar manner to the Y-gradient coil. In the case of the X-gradient coil, the magnetic field component along the z direction must be antisymmetric along the x axis and symmetric along the y direction. In this case, equation (6) becomes:

$$B_z = \quad (11)$$
$$\frac{\mu_0}{2\pi^2} \int\!\!\int_0^{+\infty} \frac{d\alpha\, d\beta}{\beta} \sqrt{\alpha^2+\beta^2}\, \sin(\alpha x)\cos(\beta y) J_x(\alpha,\beta) e^{-\sqrt{\alpha^2+\beta^2}\, z}.$$

In this case, the Fourier component of $J_x$ must be antisymmetric in $\alpha$ and in $\beta$:

$$J_x(\alpha,\beta) = -4 \int\!\!\int_0^{+\infty} dx\, dz\, \sin(\alpha x)\sin(\beta y) J_x(x,y). \quad (12)$$

Again, minimizing $\epsilon$ with respect to the current density $J_x$, the matrix equation for $J_x$ is:

$$J_x = \beta \sum_{j=1}^{N} \lambda_j \sin(\alpha x_j)\cos(\beta y_j) e^{-\sqrt{\alpha^2+\beta^2}\, z_j}. \quad (13)$$

The Lagrange multipliers $\lambda_j$ are determined, the $J_x$ and $J_y$ components of the current density are obtained, and the discrete current patterns for the current density are generated which are adequate for the creation of a high quality gradient field along the x direction. Again, the magnetic field is re-evaluated inside and outside the imaging volume by applying the Biot-Savart formula to the discrete current distribution.

As with the Y-gradient coil, six constraint points are chosen to define the characteristics of the field inside the imaging volume (see Table 2). The first three constraint points define a gradient strength of 20 mT/M inside the imaging volume with a 15% on-axis linearity and the uniformity of the gradient field inside this imaging volume is restricted to less than 20% variation from its actual value.

TABLE 2

Constraint set used for the design of X-gradient coil, values for x, y and z are in m, values for $B_{zSC}$ are in T.

| n | $x_i$ | $y_i$ | $z_i$ | $B_{zSC}$ (2n) |
|---|---|---|---|---|
| 1 | 0.0010 | 0.000 | 0.100 | 0.00002000 |
| 2 | 0.0600 | 0.000 | 0.100 | 0.00120000 |
| 3 | 0.2000 | 0.000 | 0.100 | 0.00364000 |
| 4 | 0.0010 | 0.180 | 0.100 | 0.00001800 |
| 5 | 0.0010 | 0.000 | 0.150 | 0.00002050 |
| 6 | 0.0010 | 0.000 | 0.200 | 0.00001750 |

Figure 7:
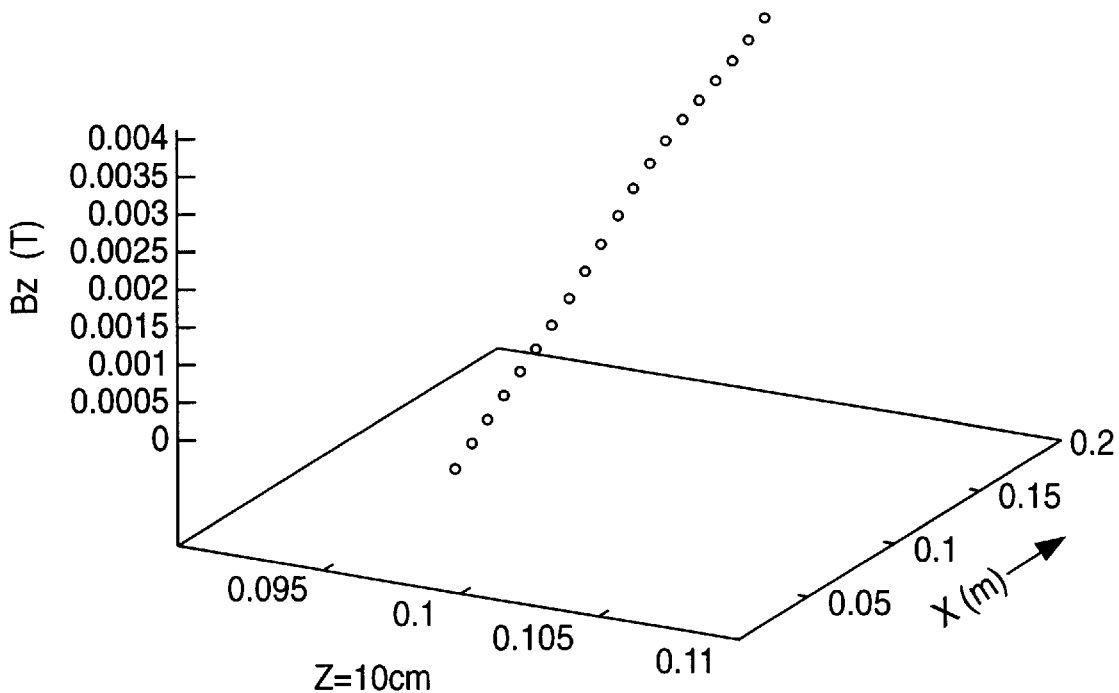
FIG. 7 is a one-half plot of the $B_z$ component of the magnetic field along the x gradient direction; and, FIG. 8 is a one-half plot of the $B_z$ component of the magnetic field along the z direction for the X-gradient coil.
Figure 8:
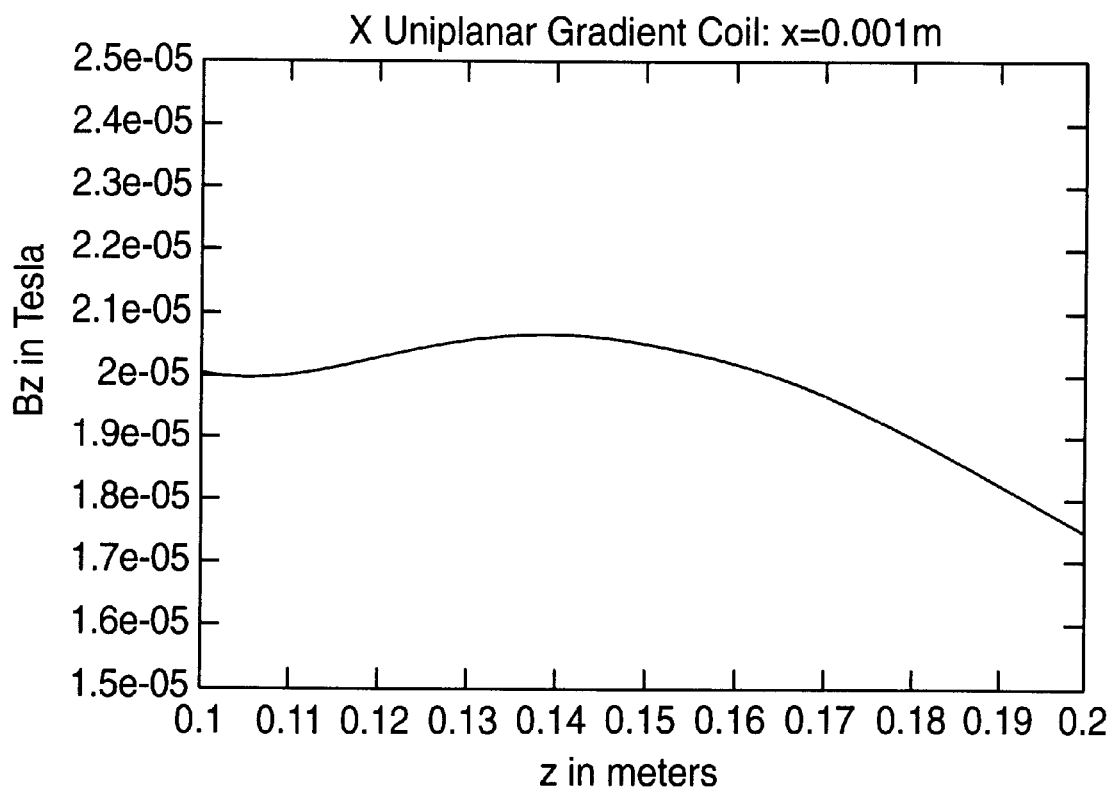

Ultimately, the discrete current pattern of 10 positive loops (as seen in FIG. 3) is generated and using the Biot-Savart law, the z component of the magnetic field is evaluated along the gradient axis x (as shown in FIG. 7) and along the z direction (as shown in FIG. 8). Again, for the same gradient strength and comparable gradient field characteristics, the slew rate of the uniplanar gradient coil is more than twice the slew rate of a corresponding bi-planar gradient coil. In one preferred embodiment, the x gradient coil is the same as the y gradient coil rotated 90 degrees in the xy plane about the z axis.

The Z-gradient coil also receives similar treatment with a few slight variations. The magnetic field component along the z direction must be monotonic along the z axis and symmetric along the x, y directions, as such equation (6) becomes:

$$B_z = \quad (14)$$
$$-\frac{i\mu_0}{2\pi^2} \int\!\!\int_0^{+\infty} \frac{d\alpha\, d\beta}{\beta} \sqrt{\alpha^2+\beta^2}\, \cos(\alpha x)\cos(\beta y) J_x(\alpha,\beta) e^{-\sqrt{\alpha^2+\beta^2}\, z}.$$

The Fourier component of $J_x$ must be symmetric in $\alpha$ and antisymmetric in $\beta$:

$$J_x(\alpha, \beta) = i4 \int\!\!\int_0^{+\infty} dx\, dz \cos(\alpha x)\sin(\beta y) J_x(x, y). \quad (15)$$

To eliminate the imaginary part, the transformation $$J_x(\alpha,\beta) = i\tilde{J}_x(\alpha,\beta) \quad (16)$$

is assumed, and the expression of the magnetic field becomes:

$$B_z = \quad (17)$$

$$\frac{i\mu_0}{2\pi^2} \int\!\!\int_0^{+\infty} \frac{d\alpha\, d\beta}{\beta} \sqrt{\alpha^2 + \beta^2}\, \cos(\alpha x)\cos(\beta y)\tilde{J}_x(\alpha, \beta) e^{-\sqrt{\alpha^2+\beta^2}\, z}.$$

Minimizing ε with respect to the current density $\tilde{J}_x$, the matrix equation for $\tilde{J}_x$ is:

$$\tilde{J}_x = \beta \sum_{j=1}^{N} \lambda_j \cos(\alpha x_j)\cos(\beta y_j) e^{-\sqrt{\alpha^2+\beta^2}\, z_j}. \quad (18)$$

The Lagrange multipliers $\lambda_j$, and the $J_x$, and $J_y$ components of the current density are determined. Then discrete current patterns for the current density which are adequate for the creation of high quality gradient field along the z direction are generated, followed by re-evaluation of the magnetic field inside and outside the imaging volume.

This time, five constraint points are chosen to define the characteristics of the field inside the imaging volume (see Table 3). The first three constraint points define a gradient strength of 20 mT/m inside the imaging volume with a 15% on-axis linearity, and the uniformity of the gradient field inside this imaging volume is restricted to less than 20% variation from its actual value. This leads to the discrete current pattern of 13 positive loops (shown in FIG. 4). Once again, for the same gradient strength and comparable gradient field characteristics, the slew rate of the uniplanar gradient coil is more than twice the slew rate of a corresponding bi-planar gradient coil.

TABLE 3

Constraint set used for the design of Z-gradient coil, values for x, y and z are in m, values for $B_{zSC}$ are in T.

| n | $x_i$ | $y_i$ | $z_i$ | $B_{zSC}$ (2n) |
|---|---|---|---|---|
| 1 | 0.0000 | 0.000 | 0.101 | 0.00002000 |
| 2 | 0.0000 | 0.000 | 0.160 | 0.00120000 |
| 3 | 0.0000 | 0.000 | 0.200 | 0.0017000 |
| 4 | 0.2000 | 0.000 | 0.101 | 0.00001600 |
| 5 | 0.0000 | 0.200 | 0.101 | 0.00001600 |

With particular reference to FIGS. 2, 3, and 4, the discrete current distributions for the Y, X, and Z-gradient coils respectively are shown. Each side of the Y-gradient coil array includes 10 positive current turns 484 each carrying a current of 205.968 amps. The X-gradient coil like the Y-gradient coil also includes a mirror image symmetrical pair of 10 positive current turns 484 each carrying a current of 205.768 amps. The Z-gradient coil includes 13 positive turns 482 each carrying a current of 177.6 amps.

In one preferred embodiment, a height adjustment mechanism 70 is connected to the uniplanar gradient coil assembly. The height adjustment mechanism 70 selectively positions the uniplanar gradient coil assembly higher or lower relative to the patient or subject being examined. This, in turn, gives rise to a corresponding change in the position of the imaging volume in relation to the subject being examining allowing areas of different depths into the subject to be imaged with the most linear gradient magnetic field pulses.

Further, an active electric shield coil 72 is positioned between the coil loop arrays and a magnetic pole piece which is on the same side of the subject being examined as the coil loop arrays to protect against eddy currents and other adverse effects.

While the gradient coil assembly 40 has been described in terms of a planar surface, it is understood that the surface may take on different shapes. Specifically, in one preferred embodiment the ends of the coil structure are flared out in order to be compatible with a patient couch of smaller widths while still being able to reside within an interior thereof. As well, the dimensions of the uniplanar gradient coil can be changed to be larger or smaller according to the preferred application, and the specified current patterns can be changed to produce increased linearity and/or greater efficiency at the cost of the other.

The invention has been described with reference to the preferred embodiments. Obviously, modifications and alterations will occur to others upon reading and understanding the proceeding detailed description. It is intended that the invention be construed as including all such modifications and alterations insofar as they come within the scope of the appended claims or the equivalents thereof.

Having thus described the preferred embodiments, the invention is now claimed to be:

1. A magnetic resonance imaging apparatus comprising:
   a main magnet having a pair of pole faces which define therebetween an examination region in which the main magnet generates a substantially uniform main magnetic field, said main magnet defining a flux return path between the pole faces;
   a couch for suspending a subject within the examination region;
   a uniplanar gradient coil assembly housed within an interior of the couch on one side of the subject, the uniplanar gradient coil assembly having coil loop arrays each residing in a plane transverse to the main magnetic field;
   a shield coil positioned between its corresponding coil loop array and the pole face that is on a common side of the subject as the uniplanar gradient coil assembly;
   a current supply for supplying electrical current pulses to the coil loop arrays such that substantially linear magnetic gradients are selectively generated across the examination region in the main magnetic field by the unipolar gradient coil assembly;
   a radio frequency pulse generator for selectively exciting magnetic resonance of dipoles disposed within the examination region;
   a receiver for receiving magnetic resonance signals from resonating dipoles within the examination region; and,
   a reconstruction processor for reconstructing an image representation from the magnetic resonance signals.

2. The magnetic resonance imaging apparatus of claim 1, wherein ends of the uniplanar gradient coil assembly are flared.

3. A magnetic resonance imaging apparatus comprising:
   a main magnet having a pair of poles which define an examination region therebetween in which a main magnetic field is generated;
   a couch for suspending a subject within the examination region;

a uniplanar gradient coil assembly positioned on one side of the subject for generating magnetic field gradients across the examination region, the uniplanar gradient coil assembly having coil loop arrays each residing in a plane transverse to the main magnetic field;

an adjustment mechanism for mechanically moving the uniplanar gradient coil assembly for imaging different areas of the subjects;

a current supply for supplying electrical current pulses to the coil loop arrays;

a radio frequency pulse generator for selectively exciting magnetic resonance of dipoles disposed within the examination region;

a receiver for receiving magnetic resonance signals from resonating dipoles within the examination region; and, a reconstruction processor for reconstructing an image representation from the magnetic resonance signals.

4. A magnetic resonance imaging apparatus comprising:

an open main magnet which generates a substantially uniform main magnetic field through an examination region;

a couch for suspending a subject within the examination region;

a uniplanar gradient coil assembly positioned on a side of the subject such that no gradient coils are on a side of the subject opposite the side on which the uniplanar gradient coil assembly is positioned, said uniplanar gradient coil assembly having coil loop arrays each residing in a plane transverse to the main magnetic field;

a current supply for supplying electrical current pulses to the coil loop arrays such that substantially linear magnetic gradients are selectively generated across the examination region in the main magnetic field;

a radio frequency pulse generator for selectively exciting magnetic resonance of dipoles disposed within the examination region;

a receiver for receiving magnetic resonance signals from resonating dipoles within the examination region; and, a reconstruction processor for reconstructing an image representation from the magnetic resonance signals.

5. The magnetic resonance imaging apparatus of claim 4, wherein the uniplanar gradient coil assembly has three coil loop arrays one each for generating a substantially linear gradient in the main magnetic field along three mutually orthogonal axes with one axis being aligned along the main magnetic field.

6. A method of magnetic resonance imaging comprising:

(a) generating a vertical main magnetic field in an examination region;

(b) supporting a subject to be examined within the examination region;

(c) positioning coil loop arrays on only one side of the subject to be examined;

(d) applying electrical current pulses to the coil loop arrays to produce magnetic field gradients in the vertical main magnetic field;

(e) selectively exciting magnetic resonance of dipoles within the examination region;

(f) receiving magnetic resonance signals from the resonating dipoles within the examination region; and, (g) reconstructing an image representation from the magnetic resonance signals.

7. A method of magnetic resonance imaging comprising:

(a) generating a vertical main magnetic field in an examination region;

(b) supporting a subject to be examined within the examin;tion region, (c) positioning coil loop arrays on only one side of the subject to be examined;

(d) mechanically moving the coil loop arrays for imaging a different area of the subjects;

(e) applying electrical current pulses to the coil loop arrays to produce magnetic field gradients in the vertical main magnetic field;

(f) selectively exciting magnetic resonance of dipoles within the examination region;

(g) receiving magnetic resonance signals from the resonating dipoles within the examination region; and, (h) reconstructing an image representation from the magnetic resonance signals.

8. A method of magnetic resonance imaging comprising:

(a) generating a vertical main magnetic field in an examination region;

(b) supporting a subject to be examined within the examination region;

(c) positioning coil loop arrays on only one side of the subject to be examined;

(d) applying electrical current pulses to the coil loop arrays to produce magnetic field gradients in the vertical main magnetic field;

(e) actively electromagnetically shielding the coil loop arrays;

(f) selectively exciting magnetic resonance of dipoles within the examination region;

(g) receiving magnetic resonance signals from the resonating dipoles within the examination region; and, (h) reconstructing an image representation from the magnetic resonance signals.

9. In a magnetic resonance imaging apparatus having a main magnet including at least one pole which defines an examination region thereabove which main magnet generates a vertical main magnetic field in the examination region, a couch which supports a subject to be examined within the examination region, a radio frequency transmitter for selectively exciting dipoles within the examination region, a receiver which receives magnetic resonance signals from dipoles resonating within the examination region, an image processor which reconstructs an image representation from the magnetic resonance signals for display on a human viewable display, and a gradient magnetic field generator, the gradient generator comprising:

a uniplanar gradient coil positioned in the interior cavity of the couch on only one side of the subject to be examined having an array of coil loops which reside in a plane transverse to the main magnetic field; and, a current supply which supplies an electrical current to the array of coil loops such that as the electrical current flows through the array of coil loops a substantially linear magnetic gradient is set up in the main magnetic field.

10. The gradient generator of claim 9, wherein no gradient coils are positioned above the subject.

11. In a magnetic resonance imaging apparatus having a main magnet including at least one pole which defines an examination region thereabove which main magnet generates a vertical main magnetic field in the examination region, a couch which supports a subject to be examined within the examination region, a radio frequency transmitter for selectively exciting dipoles within the examination region, a receiver which receives magnetic resonance signals from dipoles resonating within the examination region, an image processor which reconstructs an image representation from the magnetic resonance signals for display on a human viewable display, and a gradient magnetic field generator, the gradient generator comprising:

a uniplanar gradient coil positioned in an interior cavity of the couch on only one side of the subject to be examined, said uniplanar gradient coil having an array of coil loops which reside in a plane transverse to the main magnetic field;

a current supply which supplies an electrical current to the array of coil loops such that as the electrical current flows through the array of coil loops a substantially linear magnetic gradient is set up in the main magnetic field; and, a mechanical device which moves the uniplanar gradient coil for aligning a depth of optimal uniplanar gradient coil linearity with a depth of a region of the subject to be examined.

12. In a magnetic resonance imaging apparatus having a main magnet which generates a vertical main magnetic field through an examination region, a couch which supports a subject to be examined within the examination region, a radio frequency transmitter for selectively exciting dipoles within the examination region, a receiver which receives magnetic resonance signals from dipoles resonating within the examination region, an image processor which reconstructs an image representation from the magnetic resonance signals for display on a human viewable display, and a gradient magnetic field generator, the gradient generator comprising:

a uniplanar gradient coil positioned in an interior cavity of the couch on only one side of the subject to be examined, said uniplanar gradient coil having an array of coil loops which reside in a plane transverse to the main magnetic field;

a current supply which supplies an electrical current to the array of coil loops such that as the electrical current flows through the array of coil loops a substantially linear magnetic gradient is set up in the main magnetic field; and, a shield coil positioned between the uniplanar gradient coil and the pole of the main magnet.

* * * * *